US011527870B2

(12) United States Patent
Bailey

(10) Patent No.: US 11,527,870 B2
(45) Date of Patent: Dec. 13, 2022

(54) LIGHTNING PROTECTION SPARK GAPS FOR CABLE DEVICES

(71) Applicant: PPC BROADBAND, INC., East Syracuse, NY (US)

(72) Inventor: Paul Bailey, Camillus, NY (US)

(73) Assignee: PPC BROADBAND, INC., East Syracuse, NY (US)

( * ) Notice: Subject to any disclaimer, the term of this patent is extended or adjusted under 35 U.S.C. 154(b) by 0 days.

(21) Appl. No.: 17/165,403

(22) Filed: Feb. 2, 2021

(65) Prior Publication Data
US 2021/0242664 A1 Aug. 5, 2021

Related U.S. Application Data

(60) Provisional application No. 62/969,396, filed on Feb. 3, 2020.

(51) Int. Cl.
H01T 4/02 (2006.01)
H01T 4/10 (2006.01)

(52) U.S. Cl.
CPC .................. H01T 4/02 (2013.01); H01T 4/10 (2013.01)

(58) Field of Classification Search
CPC .............. H01T 4/02; H01T 4/08; H01T 4/10
See application file for complete search history.

(56) References Cited

U.S. PATENT DOCUMENTS

| 4,586,104 | A | * | 4/1986 | Standler | H02H 9/06 361/119 |
| 7,324,318 | B2 | * | 1/2008 | Harwath | H01R 24/48 361/119 |
| 8,730,640 | B2 | * | 5/2014 | Penwell | H01P 1/20 361/119 |
| 8,786,996 | B1 | * | 7/2014 | Shapson | H02H 9/06 361/119 |
| 8,939,796 | B2 | | 1/2015 | Darrow et al. | |
| 2004/0034388 | A1 | * | 2/2004 | Azure | A61N 2/02 607/3 |
| 2006/0002047 | A1 | | 1/2006 | Cheung et al. | |
| 2009/0109584 | A1 | * | 4/2009 | Jones | H01P 1/203 361/56 |
| 2009/0200063 | A1 | | 8/2009 | Omerovic | |
| 2011/0141646 | A1 | | 6/2011 | Jones et al. | |
| 2012/0039010 | A1 | | 2/2012 | Tresness | |
| 2012/0106018 | A1 | | 5/2012 | Shahohian et al. | |

(Continued)

OTHER PUBLICATIONS

Blaine R. Copenheaver (Authorized Officer), International Search Report and Written Opinion dated Apr. 22, 2021, PCT Application No. PCT/US2021/016205, 11 pages.

Primary Examiner — Scott Bauer
(74) Attorney, Agent, or Firm — MH2 Technology Law Group LLP

(57) ABSTRACT

A spark gap circuit includes a circuit board. The spark gap circuit also includes an input configured to connect to the circuit board and to receive signals. The spark gap circuit also includes a spark gap configured to connect to the circuit board and the input. The spark gap circuit also includes an output configured to connect to the spark gap. The spark gap is configured to cause a return loss between the input and the output to be within a first predetermined range. The spark gap is configured to cause a parasitic capacitance between the input and the output to be within a second predetermined range.

59 Claims, 9 Drawing Sheets

(56) References Cited

U.S. PATENT DOCUMENTS

2014/0198422 A1* 7/2014 Jones .................. H01G 4/005
361/91.1
2019/0221974 A1 7/2019 Bailey

* cited by examiner

LIGHTNING PROTECTION SPARK GAPS FOR CABLE DEVICES

CROSS-REFERENCE TO RELATED APPLICATIONS

This patent application claims priority to U.S. Provisional Patent Application No. 62/969,396, filed on Feb. 3, 2020, the entirety of which is incorporated by reference herein.

BACKGROUND

A spark gap includes an arrangement of two conducting electrodes separated by a gap that is usually filled with a gas such as air, designed to allow an electric spark to pass between the conductors. When the potential difference between the conductors exceeds the breakdown voltage of the gas within the gap, a spark forms, ionizing the gas and drastically reducing its electrical resistance. An electric current then flows until the path of ionized gas is broken or the current reduces below a minimum value called the "holding current." This usually happens when the voltage drops, but in some cases occurs when the heated gas rises, stretching out and then breaking the filament of ionized gas. Usually, the action of ionizing the gas is violent and disruptive, often leading to sound (e.g., ranging from a snap for a spark plug to thunder for a lightning discharge), light, and heat. Spark gaps were used historically in early electrical equipment, such as spark gap radio transmitters, electrostatic machines, and X-ray machines. Their most widespread use today is in spark plugs to ignite the fuel in internal combustion engines, but they are also used in lightning arresters and other devices to protect electrical equipment from high-voltage transients.

Conventional spark gaps have a low return loss and a high parasitic capacitance. It would be desirable to provide a spark gap that overcomes one or more of these disadvantages.

SUMMARY

A spark gap circuit is disclosed. The spark gap circuit includes a circuit board. The spark gap circuit also includes an input configured to connect to the circuit board and to receive signals. The spark gap circuit also includes a spark gap configured to connect to the circuit board and the input. The spark gap includes a first conducting electrode, a second conducting electrode that is grounded, and a dielectric material configured to be positioned within a gap between the first and second conducting electrodes. The spark gap circuit also includes a first capacitor configured to connect to the circuit board and the spark gap. The spark gap circuit also includes a second capacitor configured to connect to the circuit board and the first capacitor. The spark gap circuit also includes an output configured to connect to the circuit board and the second capacitor. The spark gap is configured to cause a return loss between the input and the output to be within a first predetermined range. The spark gap is configured to cause a parasitic capacitance between the input and the output to be within a second predetermined range. The first conducting electrode has a length from about 750 µm to about 2000 µm. The first conducting electrode has a diameter from about 500 µm to about 1 mm. The first conducting electrode has a mass from about 1 gram to about 100 grams. A signal trace extends from the input to the first capacitor. The first conducting electrode is substantially parallel with the signal trace. The second conducting electrode includes a staple with two leads and a cross bar positioned therebetween. The two leads are substantially perpendicular to the circuit board. The cross bar is substantially perpendicular to the first conducting electrode and the signal trace. The cross bar is positioned farther away from the circuit board than the first conducting electrode such that the gap exists therebetween. A thickness of the gap is from about 150 µm to about 250 µm. A thickness of the dielectric material is from about 75 µm to about 125 µm. The dielectric material includes air, paper, or a combination thereof. The dielectric material has a relative permittivity from about 1 to about 3. The first and second capacitors are configured to block direct current (DC) flow therethrough and to provide surge protection. A voltage rating of the first capacitor is greater than a voltage rating of the second capacitor. The output is configured to connect to a cable or a device.

In another embodiment, the spark gap circuit includes a circuit board. The spark gap circuit also includes an input configured to connect to the circuit board and to receive signals. The spark gap circuit also includes a spark gap configured to connect to the circuit board and the input. The spark gap includes a first conducting electrode, a second conducting electrode that is grounded, and a dielectric material positioned within a gap between the first and second conducting electrodes. The spark gap circuit also includes a first capacitor configured to connect to the circuit board and the spark gap. The spark gap circuit also includes an output configured to connect to the circuit board and the first capacitor. A signal trace extends from the input to the first capacitor. The first conducting electrode is substantially parallel with the signal trace The second conducting electrode includes a staple with two leads and a cross bar positioned therebetween. The two leads are substantially perpendicular to the circuit board. The cross bar is substantially perpendicular to the first conducting electrode and the signal trace. The cross bar is positioned farther away from the circuit board than the first conducting electrode such that the gap exists therebetween. The spark gap is configured to cause a return loss between the input and the output to be within a first predetermined range. The spark gap is configured to cause a parasitic capacitance between the input and the output to be within a second predetermined range. The output is configured to connect to a cable or a device.

In yet another embodiment, the spark gap circuit includes a circuit board. The spark gap circuit also includes an input configured to connect to the circuit board and to receive signals. The spark gap circuit also includes a spark gap configured to connect to the circuit board and the input. The spark gap circuit also includes an output configured to connect to the spark gap. The spark gap is configured to cause a return loss between the input and the output to be within a first predetermined range. The spark gap is configured to cause a parasitic capacitance between the input and the output to be within a second predetermined range.

It will be appreciated that this summary is intended merely to introduce some aspects of the present methods, systems, and media, which are more fully described and/or claimed below. Accordingly, this summary is not intended to be limiting.

BRIEF DESCRIPTION OF THE DRAWINGS

The accompanying drawings, which are incorporated in and constitute a part of this specification, illustrate embodiments of the present teachings and together with the description, serve to explain the principles of the present teachings.

DETAILED DESCRIPTION

A lightning protection spark gap circuit is described herein. In one embodiment, the spark gap circuit may be used to protect (e.g., downstream) cable television (CATV) circuits, multimedia over coax alliance (MoCA) circuits, or a combination thereof. However, as will be appreciated, the spark gap circuit may be used to protect other types of circuits as well. The spark gap may be in one of several forms: pin, staple, bridged, or a combination thereof. The spark gap(s) in the circuit may be constructed of specific materials and to specific dimensions as described herein such that they can effectively suppress the defined surge test criteria when they are implemented before through-hole (TH) or surface mount technology (SMT) series blocking capacitors, which are rated according to the surge requirements of the port and circuit to be protected. The spark gap(s) are proven to meet or exceed the given test criteria and are capable of surviving more than 5 times the number of surge events specified.

Figure 1A:
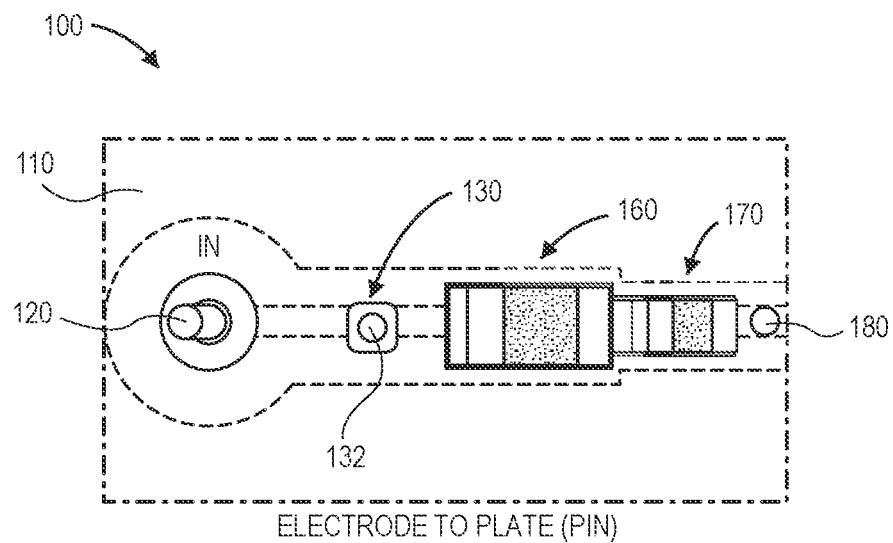
FIG. 1A illustrates a schematic view of an electrode-to-plate (pin) spark gap circuit, according to an embodiment.
Figure 1B:
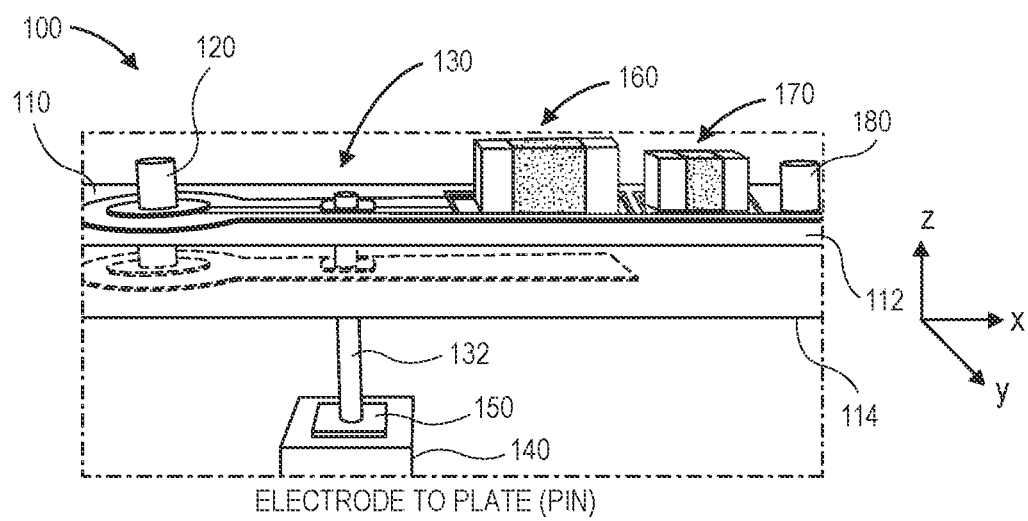
FIG. 1B illustrates a perspective view of the electrode-to-plate (pin) spark gap circuit, according to an embodiment.

FIG. 1A illustrates a schematic view of an electrode-to-plate spark gap circuit 100, and FIG. 1B illustrates a perspective view of the electrode-to-plate spark gap circuit 100, according to an embodiment. The circuit 100 may include a circuit board 110 such as a printed circuit board (PCB). The circuit board 110 may be substantially planar. For example, the circuit board 110 may be in an XY plane, as shown in FIG. 1B.

The circuit 100 may also include an input 120 that is connected to the circuit board 110. The input 120 may be configured to be connected to cable or a device. In one embodiment, the input 120 may be configured to be connected to a CATV headend. The input 120 may be configured to receive signals (e.g., from the CATV headend) that are in a first bandwidth. The first bandwidth may be from about 5 MHz to about 1002 MHz and may be referred to as the CATV bandwidth. The input 120 may also be configured to receive signals that are in a second bandwidth. The second bandwidth may be from about 1125 MHz to about 1675 MHz and may be referred to as the multimedia over coax alliance (MoCA) bandwidth.

The circuit 100 may also include a spark gap 130 that is connected to the circuit board 110 and/or the input 120. The spark gap 130 may be configured to prevent electrical surges from passing from the input 120 to an output 180 (discussed below), or vice versa. The spark gap 130 may include a conducting electrode 132. In this particular embodiment, the conducting electrode 132 is a pin. As used herein, a "pin" refers to a substantially straight wire conductor that may be tinned or bare (e.g., at the ends thereof where they connect to the circuit board 110). The ends may also be referred to as leads. The pin 132 may be made from a conductive material such as metal. The pin 132 may extend in a direction that is substantially perpendicular to the circuit board 110. For example, the pin 132 may extend in a Z direction, as shown in FIG. 1B. The pin 132 may extend at least partially through the circuit board 110. For example, at least a portion of the pin 132 may extend upward and away from an upper surface 112 of the circuit board 110. Another portion of the pin 132 may extend downward and away from a lower surface 114 of the circuit board 110. The pin 132 may be connected to the circuit board 110 via a SMT connection (e.g., including soldering). In another embodiment, the pin 132 may be connected to the circuit board 110 via a TH connection that is press-fit (e.g., pin and receptacle) or soldered.

The pin 132 may have a length from about 250 μm (~10 mil) to about 500 μm (~20 mil), about 500 μm to about 750 μm, about 750 μm to about 1000 μm, or more. The pin 132 may have a cross-sectional width (diameter) that is from about 250 μm (~10 mil) to about 1.3 mm (~50 mil) or about 500 μm to about 1 mm. The pin 132 may have a mass that is greater than the mass of conventional spark gaps. For example, the mass of the pin 132 (e.g., in the Z direction) may be from about 0.5 g to about 1 g, about 1 g to about 5 g, about 5 g to about 10 g, about 10 g to about 20 g, about 20 g to about 50 g, about 50 g to about 100 g, or more.

The spark gap 130 may also include a plate (also referred to as a second conducting electrode) 140. In one embodiment, the plate 140 may be part of a housing in which the circuit 100 is positioned. The plate 140 may be made of a conductive material such as metal. The plate 140 may be grounded. The plate 140 may be substantially planar. For example, the plate 140 may be parallel to the circuit board 110, as shown in FIG. 1B. A central longitudinal axis through the pin 132 may be substantially perpendicular to the plate 140.

A gap may be present between an end of the pin 132 and the plate 140. The gap may be from about 25 μm (~1 mil) to about 250 μm (~10 mil), about 25 μm to about 50 μm, about 50 μm to about 100 μm, about 100 μm to about 150 μm, or about 150 μm to about 250 μm. In at least one embodiment, a dielectric material 150 may be positioned in the gap between the end of the pin 132 and the plate 140. The dielectric material 150 may have a thickness from about 10 μm to about 250 μm or about 75 μm to about 125 μm. The dielectric material 150 may have a lesser conductance than the pin 132 and/or the plate 140. The dielectric material 150 may have a relative permittivity (Er) from about 1 to about 3.5, from about 1 to about 2.5, or from about 1 to about 2. In one example, the dielectric material 150 may be air with a relative permittivity of Er 1. In another example, the dielectric material 150 may be paper with a relative permittivity Er 2.3.

The circuit 100 may also include one or more capacitors (two are shown: 160, 170). The capacitors 160, 170 may be connected to the circuit board 110 and/or the spark gap 130. As shown, the capacitors 160, 170 may be connected in series, with the first capacitor 160 connected to and positioned between the spark gap 130 and the second capacitor 170. The capacitors 160, 170 may be configured to block direct current (DC) and/or to prevent surges. In at least one embodiment, the first capacitor 160 may have a greater voltage rating than the second capacitor 170. For example, the first capacitor 160 may have a voltage rating from about 200 V to about 3000 V, about 500 V to about 1500V, or about 750 V to about 1250 V, and the second capacitor 170 may have a voltage rating from about 50 V to about 2000 V, about 50 V to about 300 V, or about 50 V to about 150 V. In one embodiment, the second capacitor 170 may be omitted.

The first capacitor 160, the second capacitor 170, or a combination thereof may also have a lesser voltage rating than conventional capacitors that are located downstream of a spark gap. This may be due to the mass of the pin 132 (being greater than most conventional conducting electrodes), the cross-sectional area of the pin 132 (being lesser than most conventional conducting electrodes), the gap width between the pin 132 and the plate 140 (being lesser than in most conventional spark gaps), or a combination thereof. By virtue of the capacitors 160, 170 having a lesser voltage rating and/or smaller size, combined with the small parallel plate size (e.g., cross sectional area) of the spark gap 130, the signal(s) passing through the circuit 100 (e.g., from the input 120 to the output 180) may experience greater return loss and/or lesser parasitic capacitance (through the spark gap 130) when compared to conventional circuits that include a spark gap. For example, the return loss of the circuit 100 may be from about 15 dB to about 40 dB, about 20 dB to about 50 dB, or about 25 dB to about 60 dB within the first (e.g., CATV) signal bandwidth. The parasitic capacitance of the circuit 100 may be from about 0.01 pF to about 0.2 pF, about 0.01 pF to about 0.1 pF, or about 0.01 pF to about 0.05 pF.

The pin(s) (e.g., pin 132) that extend through the circuit board 110 may be aligned with the signal trace. As used herein, a "signal trace" refers to a path of the signal (e.g., between the input 120 and the capacitor 160). This adds substantial mass in the direction of the Z axis, but adds little to no width to the trace in the direction of the X axis and/or Y axis. As a result, the pin 132 may affect (e.g., increase) the trace impedance, as measured by return loss, from about 0.01 dB to 1 dB, about 0.1 dB to about 0.5 dB, or about 0.5 dB to about 1 dB, or more.

As mentioned above, the circuit 100 may also include the output 180. The output 180 may be connected to the circuit board 110 and/or the capacitor(s) 160, 170. The output 180 may be configured to be connect to a user premises (e.g., inside a home). For example, the output 180 may be configured to connect to a cable and/or device such as a CATV device, a MoCA device, or a combination thereof.

Figure 2A:
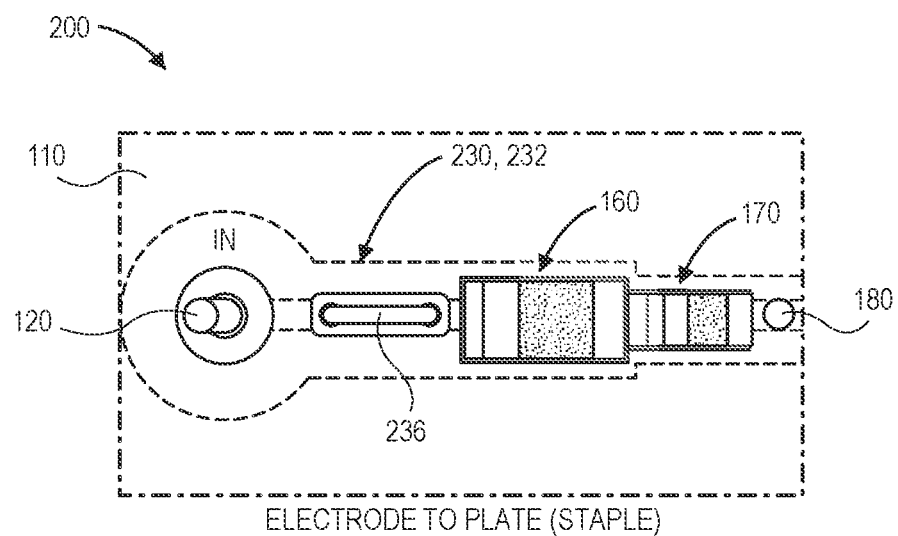
FIG. 2A illustrates a schematic view of an electrode-to-plate (staple) spark gap circuit, according to an embodiment.
Figure 2B:
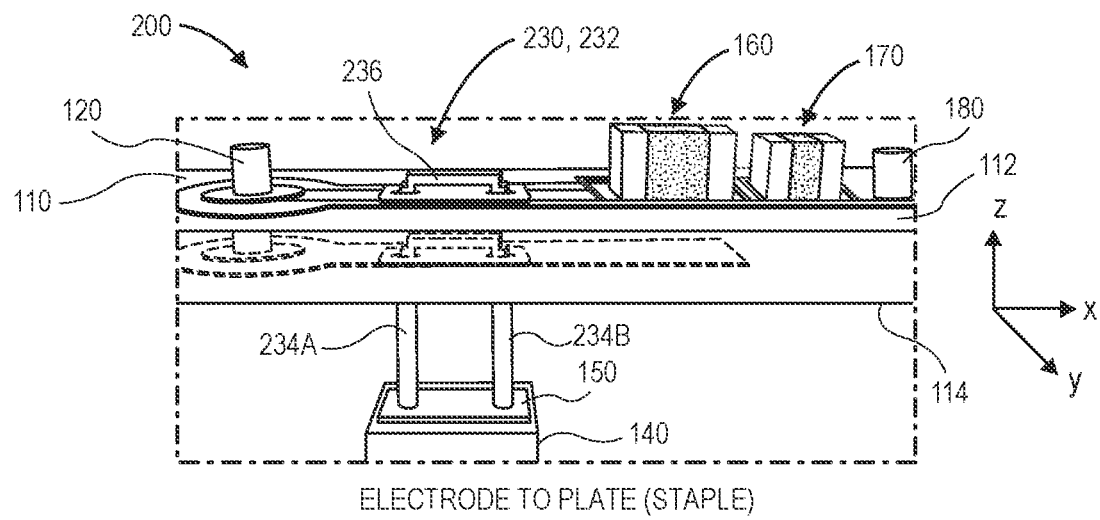
FIG. 2B illustrates a perspective view of the electrode-to-plate (staple) spark gap circuit, according to an embodiment.

FIG. 2A illustrates a schematic view of another electrode-to-plate spark gap circuit 200, and FIG. 2B illustrates a perspective view of the electrode-to-plate spark gap circuit 200, according to an embodiment. The circuit 200 may be similar to the circuit 100, and similar reference numbers are used where applicable.

Instead of, or in addition to, the spark gap 130 (from FIGS. 1A and 1B), the circuit 200 may include a spark gap 230. The spark gap 230 may be connected to the circuit board 110, the input 120, the capacitors 160, 170, or a combination thereof. As shown, the spark gap 230 is connected to and positioned between the input 120 and the capacitor 160. The spark gap 230 may include a conducting electrode 232. In this particular embodiment, the conducting electrode 232 is a staple. As used herein, a "staple" refers to a pin or wire conductor that has at least two bends, where the bent ends are tinned or bare to facilitate attachment to a circuit. These end portions are referred to as the leads, whether they are SMT or TH. Although the ends may be soldered at the PCT, they may not be soldered at the location of the spark gap.

The staple 232 may be made from a conductive material such as metal. The staple 232 in FIGS. 2A and 2B may differ from the pin 132 in FIGS. 1A and 1B because it has two staple leads, which increases the potential to achieve an initial arc and may have about two times the mass and cross-sectional area. The two staple leads (also referred to as pins) 234A, 234B may extend in a direction that is substantially perpendicular to the circuit board 110. For example, the staple leads 234A, 234B may extend in the Z direction, as shown in FIG. 2B. The staple leads 234A, 234B may extend at least partially through the circuit board 110. For example, at least a portion of the staple leads 234A, 234B may extend upward and away from the upper surface 112 of the circuit board 110. Another portion of the staple leads 234A, 234B may extend downward and away from the lower surface 114 of the circuit board 110. The staple leads 234A, 234B may be connected to the circuit board 110 via a SMT connection (e.g., including soldering). In another embodiment, the staple leads 234A, 234B may be connected to the circuit board 110 via a TH connection that is press-fit (e.g., pin and receptacle) or soldered.

The staple 232 may also include a cross bar 236 that is connected to (e.g., upper) ends of the staple leads 234A, 234B. The cross bar 236 may be substantially parallel to the circuit board 110 and substantially perpendicular to the staple leads 234A, 234B. In one embodiment, a gap may be present between the cross bar 236 and the circuit board 110. In another embodiment, no gap may be present, and the cross bar 236 may contact the circuit board 110.

The length of the cross bar 236 (e.g., the lateral distance between the staple leads 234A, 234B) may be about 250 μm (~10 mil) to about 500 μm (~20 mil). The staple 232 (e.g., the staple leads 234A, 234B, the cross bar 236, or a combination thereof) may have a cross-sectional width (diameter) that is from about 250 μm (~10 mil) to about 1.3 mm (~50 mil) or about 500 μm to about 1 mm. The staple 232 (e.g., the staple leads 234A, 234B, the cross bar 236, or a combination thereof) may have a mass that is greater than the mass of conventional spark gaps. For example, the mass may be from about 0.5 g to about 1 g, about 1 g to about 5 g, about 5 g to about 10 g, about 10 g to about 20 g, about 20 g to about 50 g, about 50 g to about 100 g, or more.

Central longitudinal axes through the staple leads 234A, 234B may be substantially perpendicular to the plate 140. The gap may be present between ends of the staple leads 234A, 234B and the plate 140. The dielectric material 150 may be positioned in the gap between the ends of the staple leads 234A, 234B and the plate 140. The dielectric material 150 may have the same size, shape, and properties as described above.

The first capacitor 160, the second capacitor 170, or a combination thereof may have a lesser voltage rating than conventional capacitors that are located downstream of a spark gap. This may be due to the mass of the staple 232 (being greater than most conventional conducting electrodes), the cross-sectional area of the staple 232 (being lesser than most conventional conducting electrodes), the gap width between the staple 232 and the plate 140 (being lesser than in most conventional spark gaps), or a combination thereof. By virtue of the capacitors 160, 170 having a lesser voltage rating and smaller size, combined with the small parallel plate size (e.g., cross sectional area) of the spark gap 230, the signal(s) passing through the circuit 200 (e.g., from the input 120 to the output 180) may experience greater return loss and/or lesser parasitic capacitance (through the spark gap 230) when compared to conventional circuits that include a spark gap. For example, the return loss of the circuit 200 may be from about 10 dB to about 50 dB or about 15 dB to about 40 dB within the first (e.g., CATV) signal bandwidth. The parasitic capacitance of the circuit 200 may be from about 0.01 pF to about 0.2 pF, about 0.01 pF to about 0.1 pF, or about 0.01 pF to about 0.05 pF.

The cross bar 236 may be substantially parallel (e.g., aligned) with the signal trace. This adds substantial mass in the direction of the Z axis, but adds little to no width to the trace in the direction of the X axis and/or Y axis. As a result, the staple 232 may affect (e.g., increase) the trace impedance, as measured by return loss, from about 0.01 dB to 1 dB, about 0.1 dB to about 0.5 dB, or about 0.5 dB to about 1 dB, or more.

Figure 3A:
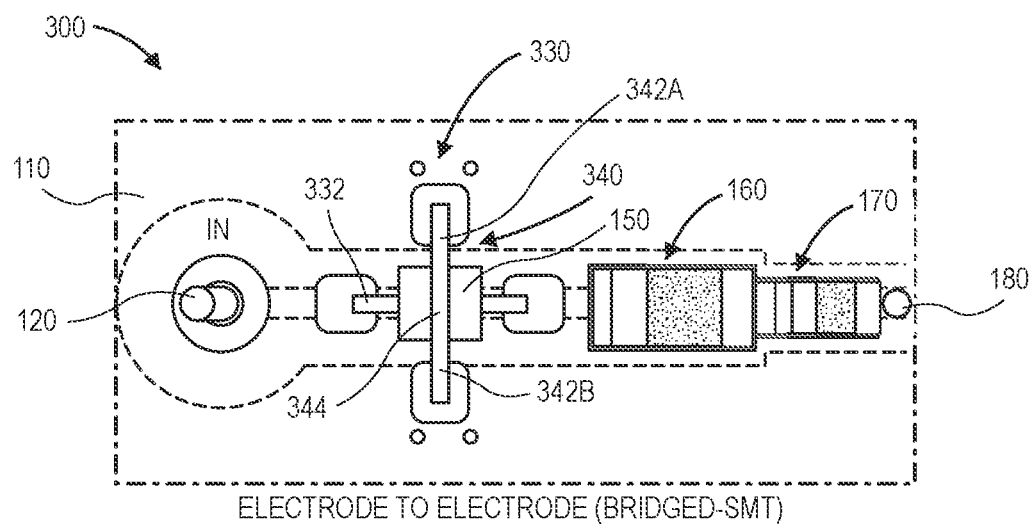
FIG. 3A illustrates a schematic view of an electrode-to-electrode (bridged-SMT) spark gap circuit, according to an embodiment.
Figure 3B:
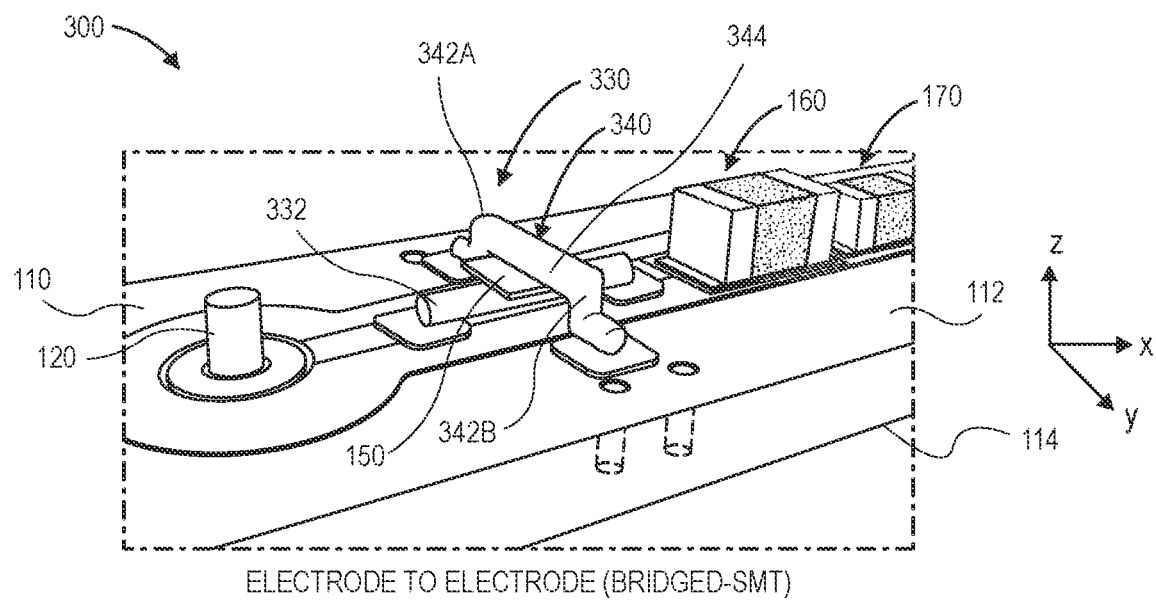
FIG. 3B illustrates a perspective view of the electrode-to-electrode (bridged-SMT) spark gap circuit, according to an embodiment.

FIG. 3A illustrates a schematic view of an electrode-to-electrode spark gap circuit 300, and FIG. 3B illustrates a perspective view of the electrode-to-electrode spark gap circuit 300, according to an embodiment. The circuit 300 may be similar to the circuits 100 and/or 200, and similar reference numbers are used where applicable.

Instead of, or in addition to, the spark gaps 130 and/or 230, the circuit 300 may include a spark gap 330. The spark gap 330 may be connected to the circuit board 110, the input 120, the capacitors 160, 170, or a combination thereof. As shown, the spark gap 330 is connected to and positioned between the input 120 and the capacitor 160. The spark gap 330 may include bridged surface mounted technology (SMT), as described below.

The spark gap 330 may include one or more conducting electrodes (two are shown: 332 and 340). In this particular embodiment, the conducting electrode 332 may be or include a pin. The pin 332 may be made from a conductive material such as metal. The pin 332 may be positioned above the circuit board 110 and connected to the circuit board 110, the input 120, the capacitor 160, or a combination thereof via SMT. The pin 332 may extend in a direction that is substantially parallel to the circuit board 110, and in particular the signal trace.

The conducting electrode 340 may be or include a staple 340. The staple 340 may be used instead of, or in addition to, the plate 140 from the previous embodiments. In at least one embodiment, omitting the plate 140 may allow the circuit 300 to be self-contained and function without the plate 140 or housing. The staple 340 may be made of a conductive material such as metal. The staple 340 may be positioned above the circuit board 110 and connected to the circuit board 110 via SMT. At least a portion of the staple 340 may be positioned above the dielectric material 150 and/or the pin 332. The staple 340 may be grounded.

The staple 340 may include two staple leads (also referred to as pins) 342A, 342B that enable the staple 340 to be mounted to the circuit board 110 via SMT. In at least one embodiment, the staple leads 342A, 342B may not extend through the circuit board 110. In at least one embodiment, the staple leads 342A, 342B may be connected (e.g., surface mounted) to the circuit board 110.

The staple 340 may also include a staple cross bar 344 that is connected to (e.g., upper) ends of the staple leads 342A, 342B. The staple cross bar 344 may be substantially parallel to the circuit board 110. The staple cross bar 344 may also be substantially perpendicular to the signal trace, the pin 332, and/or the staple leads 342A, 342B. Thus, the staple 340 (e.g., including the staple leads 342A, 342B and the staple cross bar 344) may have the shape of a horseshoe or the Greek letter Omega ($\Omega$).

A gap may exist between the pin 332 and the staple cross bar 344. The gap may be from about 25 μm (~1 mil) to about 250 μm (~10 mil), about 25 μm to about 50 μm, about 50 μm to about 100 μm, about 100 μm to about 150 μm, or about 150 μm to about 250 μm. The dielectric material 150 may be positioned in the gap between the pin 332 and the cross bar 344. The dielectric material 150 may have the same size, shape, and properties as described above.

The pin 332, the staple 340, or both may have a cross-sectional width (diameter) that is from about 250 μm (~10 mil) to about 1.3 mm (~50 mil) or about 500 μm to about 1 mm. The pin 332, the staple 340, or a combination thereof may have a mass that is greater than the mass of conventional spark gaps. For example, the mass may be from about 0.5 g to about 1 g, about 1 g to about 5 g, about 5 g to about 10 g, about 10 g to about 20 g, about 20 g to about 50 g, about 50 g to about 100 g, or more.

The first capacitor 160, the second capacitor 170, or a combination thereof may have a lesser voltage rating than conventional capacitors that are located downstream of a spark gap. This may be due to the mass of the pin 332, the staple 340, or both (being greater than most conventional conducting electrodes), the cross-sectional area of the pin 332, the staple 340, or both (being lesser than most conventional conducting electrodes), the gap width between the pin 332 and the staple 340 (being lesser than in most conventional spark gaps), or a combination thereof. By virtue of the capacitors 160, 170 having a lesser voltage rating and smaller size, combined with the small parallel plate size (e.g., cross sectional area) of the spark gap 330, the signal(s) passing through the circuit 300 (e.g., from the input 120 to the output 180) may experience greater return loss and/or lesser parasitic capacitance (through the spark gap 330) when compared to conventional circuits that include a spark gap. For example, the return loss of the circuit 300 may be from about 10 dB to about 50 dB or about 15 dB to about 40 dB within the first (e.g., CATV) signal bandwidth. The parasitic capacitance of the circuit 300 may be from about 0.01 pF to about 0.2 pF, about 0.01 pF to about 0.1 pF, or about 0.01 pF to about 0.05 pF.

As mentioned above, the pin 332 may be above the circuit board 110 and substantially parallel (e.g., aligned) with the signal trace. The pin 332 and/or the staple 340 may add substantial mass in the direction of the Z axis, but add little to no width to the trace in the direction of the X axis and/or Y axis. As a result, the pin 332 may and/or the staple 340 affect (e.g., increase) the trace impedance, as measured by return loss, from about 0.01 dB to 1 dB, about 0.1 dB to about 0.5 dB, or about 0.5 dB to about 1 dB, or more.

Figure 4A:
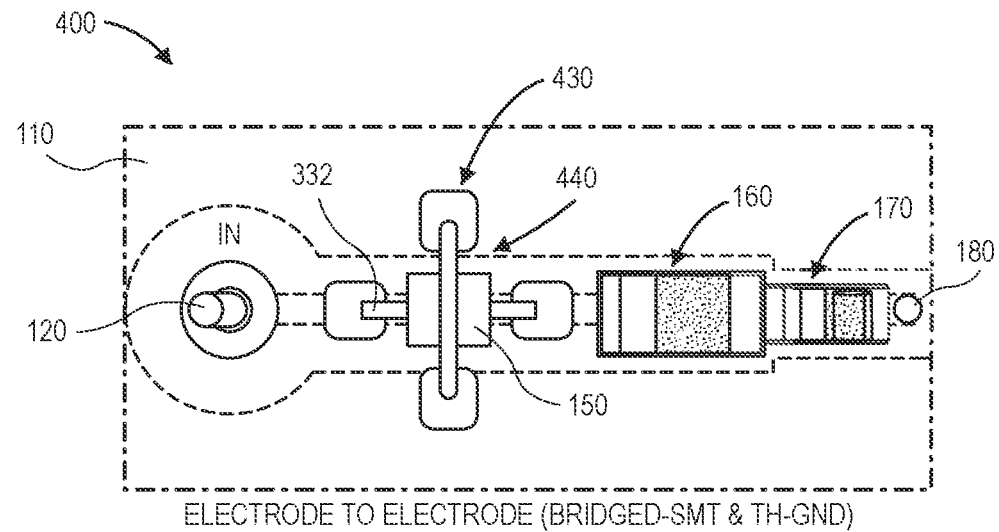
FIG. 4A illustrates a schematic view of an electrode-to-electrode (bridged-SMT and TH-ground) spark gap circuit, according to an embodiment.
Figure 4B:
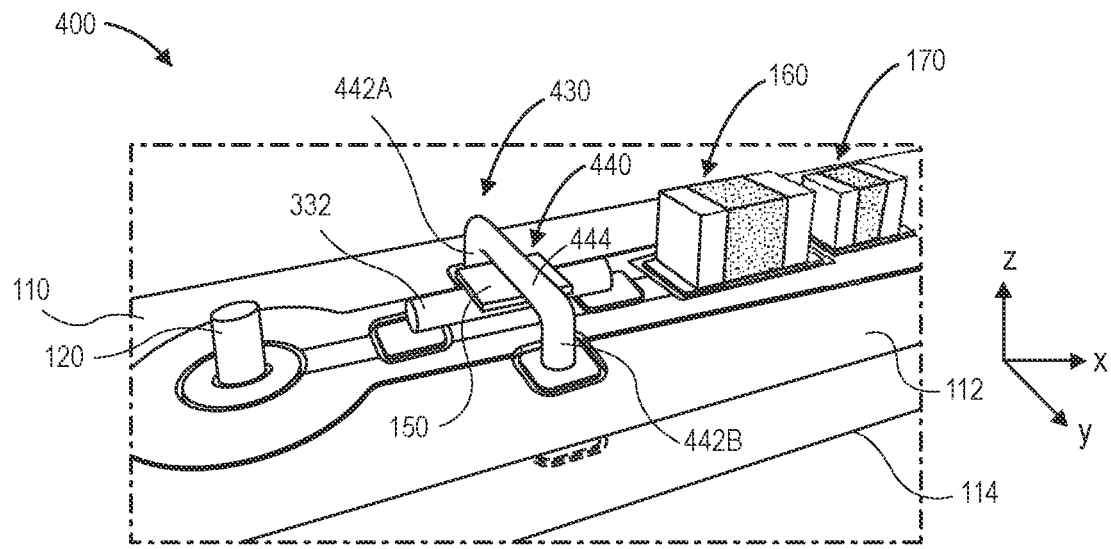
FIG. 4B illustrates a perspective view of the electrode-to-electrode (bridged-SMT/and TH-ground) spark gap circuit, according to an embodiment.

FIG. 4A illustrates a schematic view of another electrode-to-electrode spark gap circuit 400, and FIG. 4B illustrates a perspective view of the electrode-to-electrode spark gap circuit 400, according to an embodiment. The circuit 400 may be similar to the circuits 100, 200, and/or 300, and similar reference numbers are used where applicable.

Instead of, or in addition to, the spark gaps 130, 230, and/or 330, the circuit 400 may include a spark gap 430. The spark gap 430 may be connected to the circuit board 110, the input 120, the capacitors 160, 170, or a combination thereof. As shown, the spark gap 430 is connected to and positioned between the input 120 and the capacitor 160. The spark gap 430 may include bridged SMT. For example, the pin 332 may be positioned above the circuit board 110 and connected to the circuit board 110, the input 120, the capacitor 160, or a combination thereof via SMT. In one embodiment, the pin 332 may not extend through the circuit board 110.

The circuit 400 may also include through-hole (TH) grounding. More particularly, the staple 440 may include two staple leads (also referred to as pins) 442A, 442B that are configured to extend through the circuit board 110 (e.g., in the Z direction). Lower ends of the staple leads 442A, 442B (e.g., below the circuit board 110) may be grounded. This may differ or improve upon the embodiment in FIGS. 3A and 3B because inserting the staple leads 442A, 442B vertically through holes in the circuit board 110 may provide alignment of the staple leads 442A, 442B.

The first capacitor 160, the second capacitor 170, or a combination thereof may have a lesser voltage rating than conventional capacitors that are located downstream of a spark gap. This may be due to the mass of the pin 332, the staple 440, or both (being greater than most conventional conducting electrodes), the cross-sectional area of the pin 332, the staple 440, or both (being lesser than most conventional conducting electrodes), the gap width between the pin 332 and the staple 440 (being lesser than in most conventional spark gaps), or a combination thereof. By virtue of the capacitors 160, 170 having a lesser voltage rating and smaller size, combined with the small parallel plate size (e.g., cross sectional area) of the spark gap 430, the signal(s) passing through the circuit 400 (e.g., from the input 120 to the output 180) may experience greater return loss and/or lesser parasitic capacitance (through the spark gap 430) when compared to conventional circuits that include a spark gap. For example, the return loss of the circuit 400 may be from about 10 dB to about 50 dB or about 15 dB to about 40 dB within the first (e.g., CATV) signal bandwidth. The parasitic capacitance of the circuit 400 may be from about 0.01 pF to about 0.2 pF, about 0.01 pF to about 0.1 pF, or about 0.01 pF to about 0.05 pF.

As mentioned above, the pin 332 may be above the circuit board 110 and substantially parallel (e.g., aligned) with the signal trace. The pin 332 and/or the staple 340 may add substantial mass in the direction of the Z axis, but add little to no width to the trace in the direction of the X axis and/or Y axis. As a result, the pin 332 may and/or the staple 440 affect (e.g., increase) the trace impedance, as measured by return loss, from about 0.01 dB to 1 dB, about 0.1 dB to about 0.5 dB, or about 0.5 dB to about 1 dB, or more.

Figure 5A:
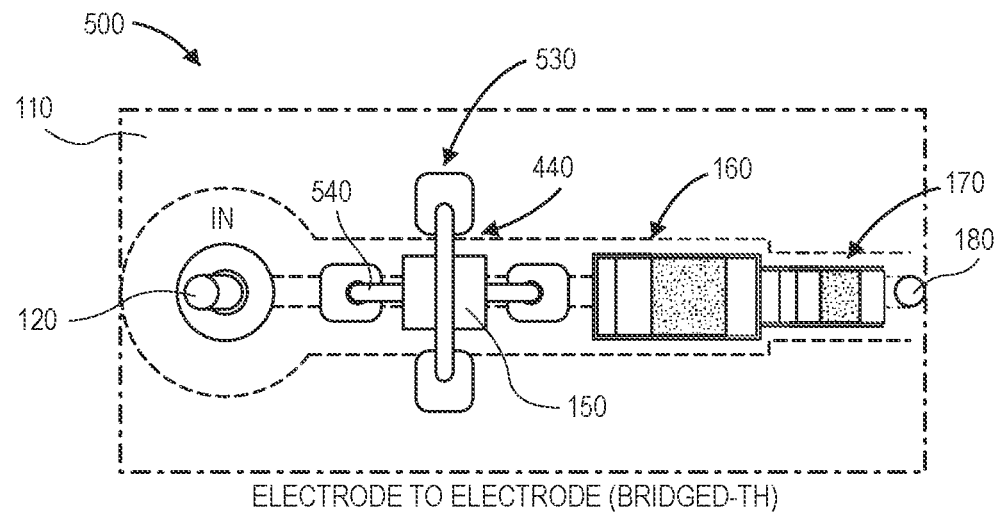
FIG. 5A illustrates a schematic view of an electrode-to-electrode (bridged-TH) spark gap circuit, according to an embodiment.
Figure 5B:
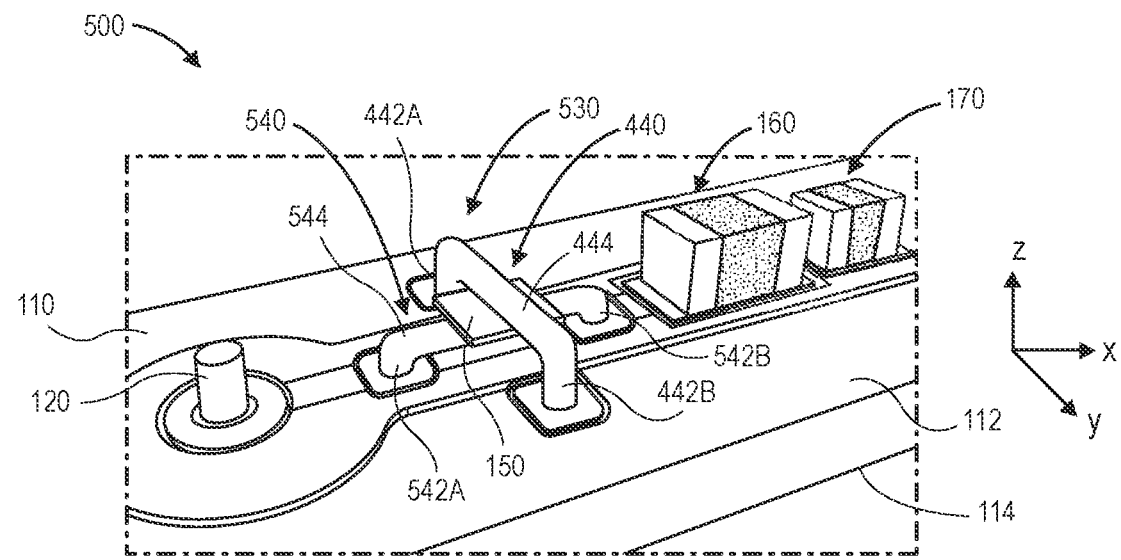
FIG. 5B illustrates a schematic view of the electrode-to-electrode (bridged-TH) spark gap circuit, according to an embodiment.

FIG. 5A illustrates a schematic view of another electrode-to-electrode spark gap circuit 500, and FIG. 5B illustrates a schematic view of the electrode-to-electrode spark gap circuit 500, according to an embodiment. The circuit 500 may be similar to the circuits 100, 200, 300, and/or 400, and similar reference numbers are used where applicable.

Instead of, or in addition to, the spark gaps 130, 230, 330, and/or 430, the circuit 500 may include a spark gap 530. The spark gap 530 may be connected to the circuit board 110, the input 120, the capacitors 160, 170, or a combination thereof. As shown, the spark gap 530 is connected to and positioned between the input 120 and the capacitor 160. In the spark gap 530, the pin 332 (from FIGS. 3A, 3B, 4A, and 4B) may be replaced with a staple 540 that includes staple leads 542A, 542B and a staple cross bar 544. The staple 540 and the staple 440 may be bridged.

Rather than the staple 540 being surface mounted to the circuit board 110, the staple leads 542A, 542B may extend through the circuit board 110. This may differ or improve upon the embodiment in FIGS. 4A and 4B because inserting the staple leads 542A, 542B vertically through holes in the circuit board 110 may provide alignment of the staple leads 542A, 542B. In addition, the circuit board 110 may also include through-hole (TH) grounding. More particularly, the staple leads 542A, 542B may extend through the circuit board 110 (e.g., in the Z direction). Lower ends of the staple leads 542A, 542B (e.g., below the circuit board 110) may be grounded.

Figure 6A:
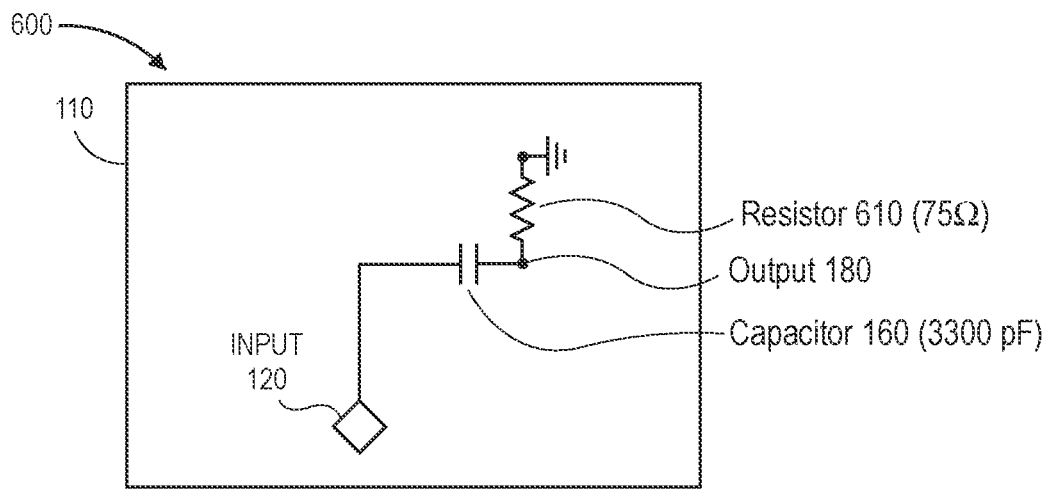
FIG. 6A illustrates a schematic view of a circuit with no spark gap and no shunt capacitor, according to an embodiment.

FIG. 6A illustrates a schematic view of a circuit 600 with no spark gap and no shunt capacitor, according to an embodiment. The circuit 600 may be similar to the circuits 100, 200, 300, 400, and/or 500, and similar reference numbers are used where applicable. For example, the circuit 600 may include the circuit board 110, the input 120, the capacitor (e.g., a blocking capacitor) 160, and the output 180. The circuit 600 may also include a resistor 610 that is connected to the capacitor 160. The resistor 610 may be on the side of the capacitor 160 that is opposite to the input 120. The resistor 610 may have a resistance (e.g., 75 ohms). The resistor 610 may be grounded.

Figure 6B:
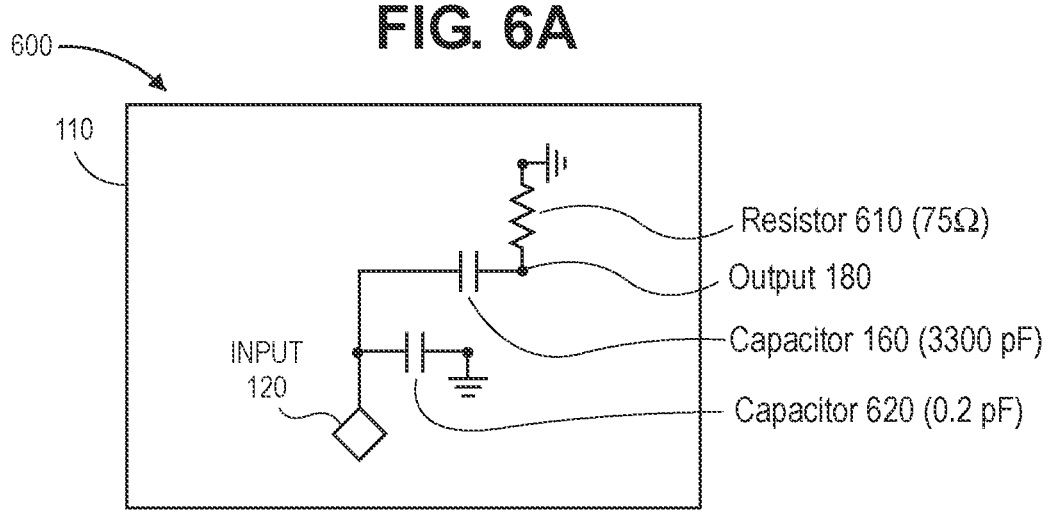
FIG. 6B illustrates a schematic view of the circuit in FIG. 6A with no spark gap and a shunt capacitor, according to an embodiment.

FIG. 6B illustrates a schematic view of the circuit 600 with no spark gap and a shunt capacitor 620, according to an embodiment. A shunt capacitor 620 is connected to the circuit 600. More particularly, a first side of the shunt capacitor 620 is connected to and positioned between the input 120 and the capacitor 160. A second side of the shunt capacitor 620 may be grounded. In this embodiment, the shunt capacitor 620 has a capacitance of 0.2 pF.

Figure 6C:
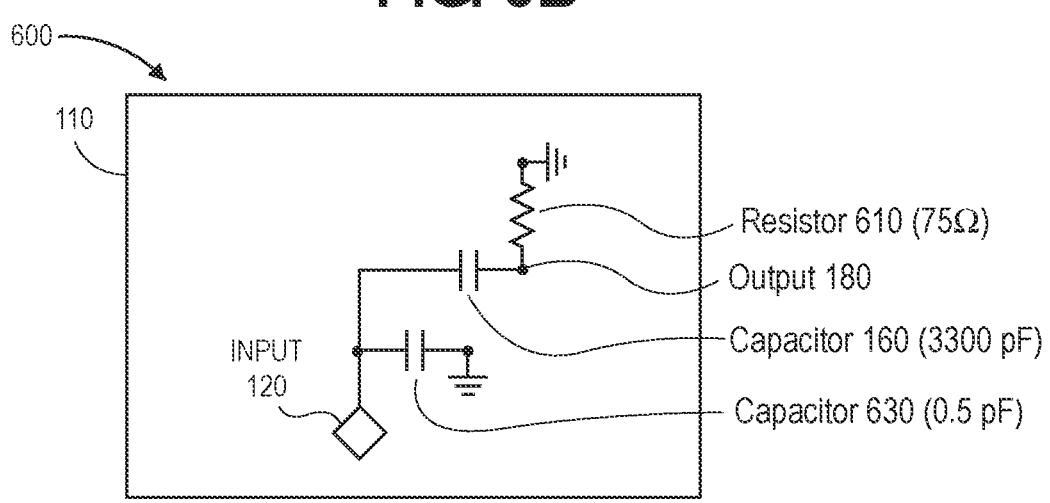
FIG. 6C illustrates a schematic view of the circuit in FIG. 6A with no spark gap and a different shunt capacitor, according to an embodiment.

FIG. 6C illustrates a schematic view of the circuit 600 with no spark gap and a different shunt capacitor 630, according to an embodiment. In this embodiment, the shunt capacitor 630 has a capacitance of 0.5 pF. The circuit 600 shown in FIGS. 6A-6C represents a baseline test circuit with no spark gap.

Figure 7:
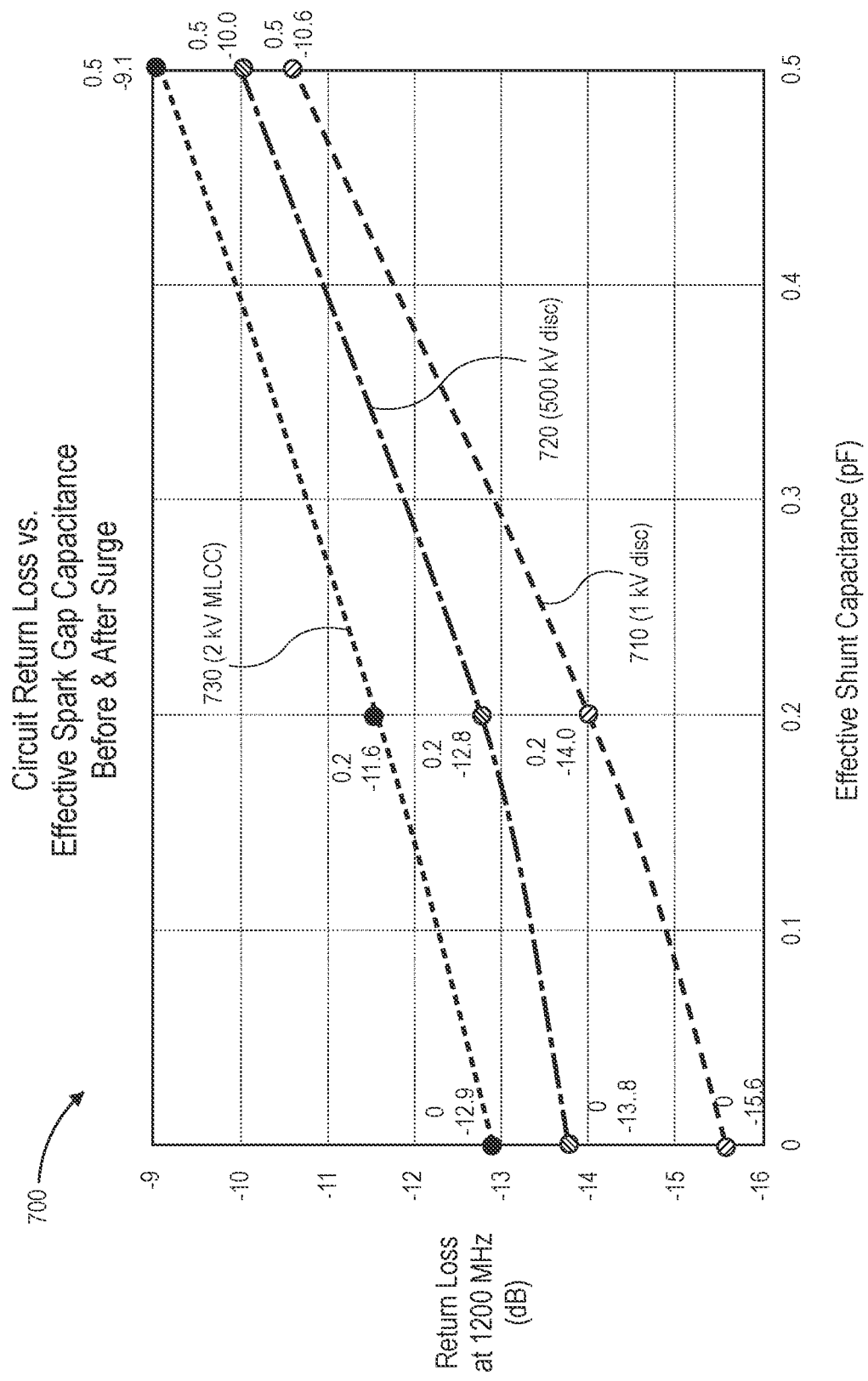
FIG. 7 illustrates a graph showing return loss versus effective shunt capacitance of the circuit shown in FIGS. 6A-6C, according to an embodiment.

FIG. 7 illustrates a graph 700 showing return loss versus effective shunt capacitance of the circuit 600 shown in FIGS. 6A-6C, according to an embodiment. The X axis represents effective shunt capacitance in picofarads (pF), and the Y axis represents the return loss at 1200 MHz in decibels (dB). The return loss is a measure of the impedance mismatch, also known as the reflection coefficient, and the shunt capacitance is a reactance, as described by the following equations:

$$Z = (R^2 + X^2)^{0.5}$$  Equation 1

When the capacitance increases, the impedance increases, the reflection coefficient increases, and the return loss decreases or degrades.

The return loss may be calculated by:

$$\text{ReturnLoss} = -20 \cdot \log_{10} |\Gamma| \, [[dB]] \qquad \text{Equation 2}$$

The reflection coefficient $\Gamma$ may be calculated by:

$$|\Gamma| = \left| \frac{Z_{load} - Z_0}{Z_{load} + Z_0} \right| \qquad \text{Equation 3}$$

The impedance Z may be calculated by:

$$Z = |\underline{Z}| = R + jX_C = \sqrt{R^2 + X_C^2} \qquad \text{Equation 4}$$

The capacitance reactance $X_C$ may be calculated by:

$$X_C = \frac{1}{\omega C} = \frac{1}{2\pi f C} \qquad \text{Equation 5}$$

In these equations, F=frequency, C=capacitance, R=Real component, X=Reactive component, Z=circuit impedance, and Zo—Nominal impedance (e.g., 75 ohms).

The bottom line 710 represents results for when the capacitor 160 is a disc with a 1 kV rating. The middle line 720 represents results for when the capacitor 160 is a disc with a 500 V rating. The top line 730 represents results for when the capacitor 160 is a multilayer ceramic capacitor (MLCC) with a 2 kV rating.

Figure 8A:
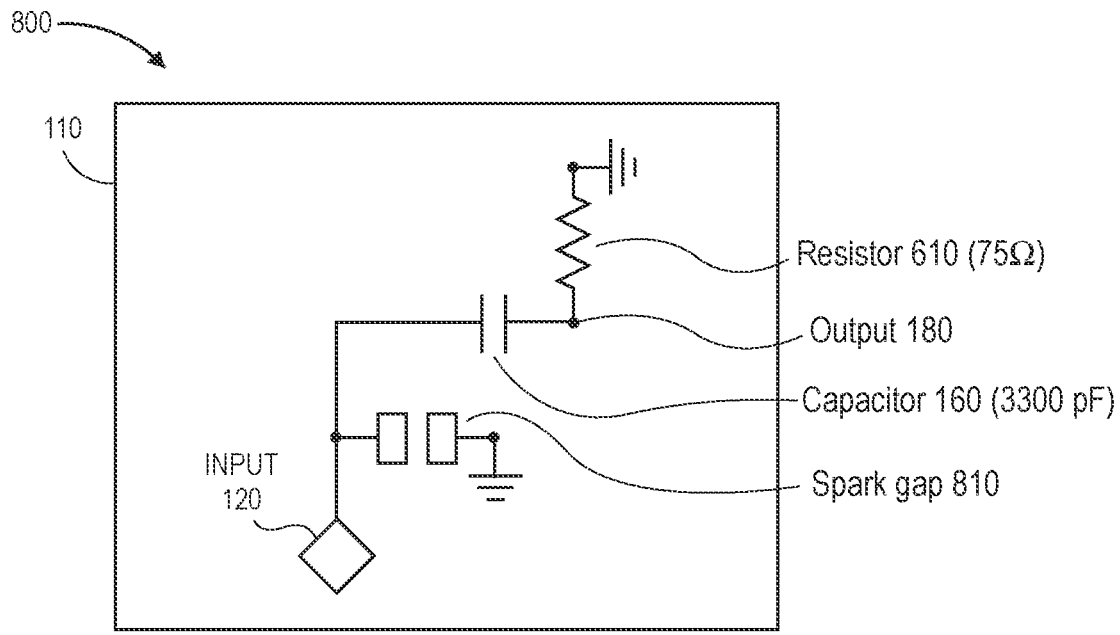
FIG. 8A illustrates a schematic view of a circuit with a spark gap before and/or after a surge event or surge test, according to an embodiment.
Figure 8B:
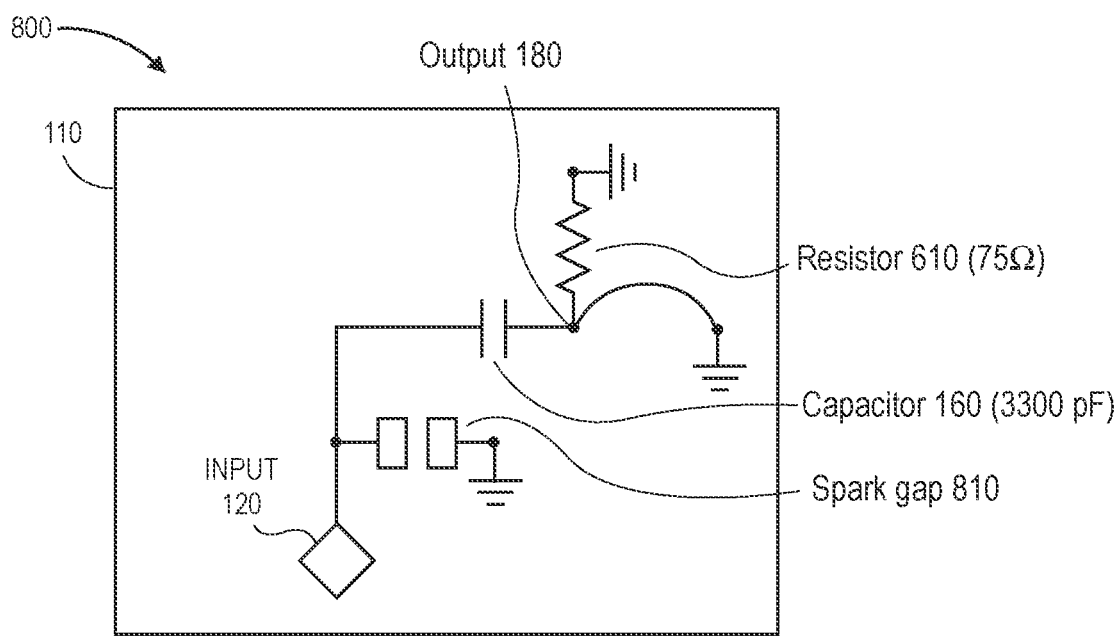
FIG. 8B illustrates a schematic view of the circuit with the spark gap during a surge event or surge test, according to an embodiment.

FIG. 8A illustrates a schematic view of a circuit 800 with a spark gap 810, before and/or after a surge event or surge test, and FIG. 8B illustrates a schematic view of the circuit 800 with the spark gap 810 during a surge event or surge test, according to an embodiment. The circuit 800 may be similar to the circuits 100, 200, 300, 400, 500 and/or 600, and similar reference numbers are used where applicable. For example, the circuit 800 may include the circuit board 110, the input 120, the capacitor (e.g., a blocking capacitor) 160, the output 180, and the resistor 610.

The circuit 800 may also include the spark gap 820. A first side of the spark gap 820 may be connected to and positioned between the input 120 and the capacitor 160. The second side of the spark gap 820 may be grounded. The spark gap 820 may be or include any of the spark gaps 130, 230, 330, 430, 530 discussed above. For example, the spark gap 820 may include two conducting electrodes (e.g., electrodes 332 and 340) that are crossed (e.g., bridged). The electrodes may be made of tinned copper wire and have a cross-sectional width (e.g., diameter) of about 635 μm (i.e., ~25 mil). The dielectric material 150 may be paper having a thickness of about 89 μm (i.e., ~3.5 mil).

Figure 9:
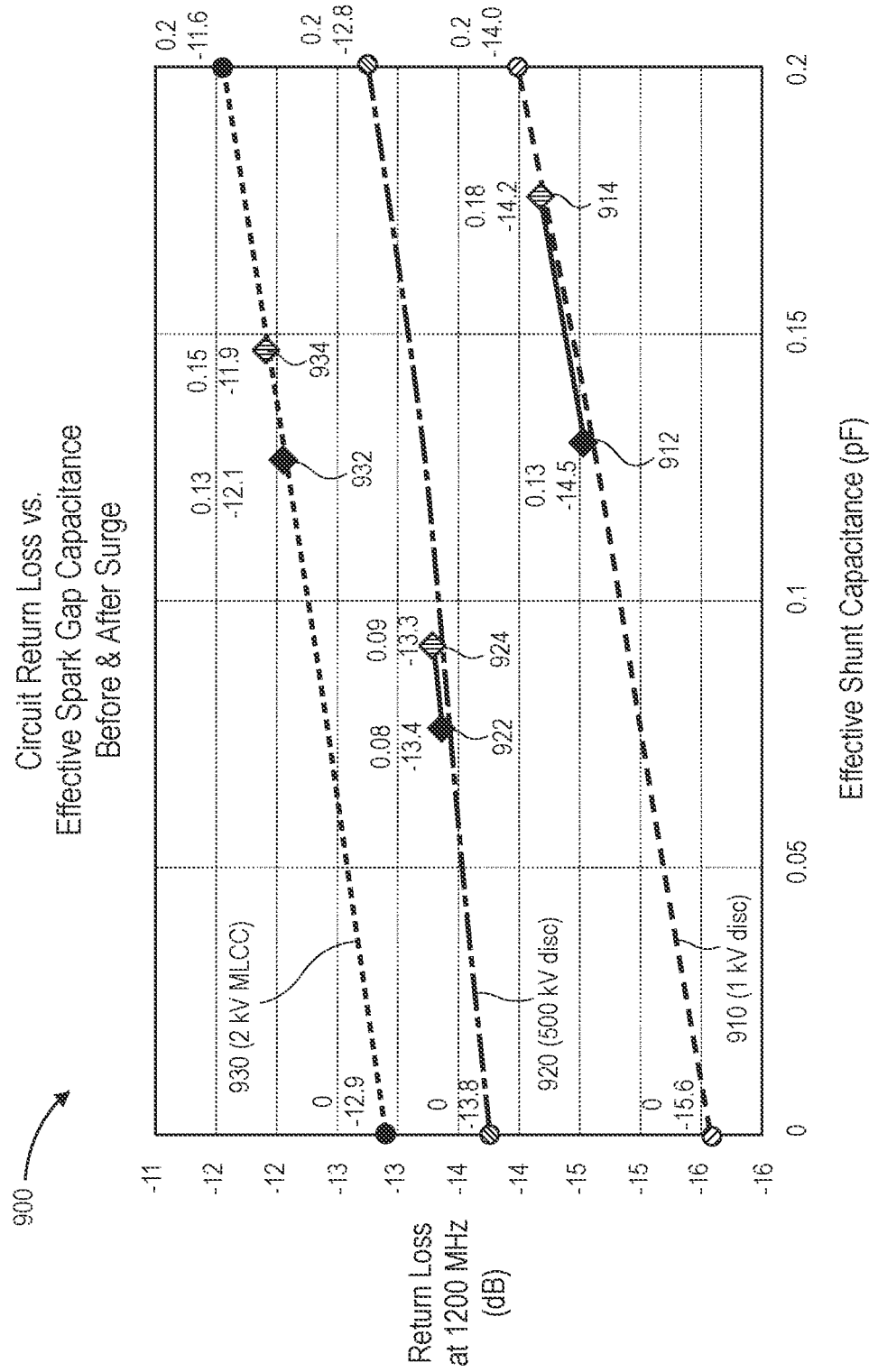
FIG. 9 illustrates a graph showing return loss versus effective capacitance of a circuit with a spark gap (e.g., the circuit in FIGS. 8A and 8B), before and after electrical surge(s), according to an embodiment.

FIG. 9 illustrates a graph 900 showing return loss versus effective capacitance of the circuit 800 before and after an electrical surge, according to an embodiment. The graphs 700, 900 may be compared to illustrate the performance of a circuit (e.g., circuit 800) with a spark gap over the baseline performance of a circuit (e.g., circuit 600) without a spark gap.

The bottom line 910 represents results when the capacitor 160 is a disc with a 1 kV rating. As shown at point 912, before the surge test, the return loss is −12.1 when the effective capacitance is 0.13 pF. At point 914, after the surge test, the return loss is −11.9 when the effective capacitance is 0.15 pF. The middle line 920 represents results when the capacitor 160 is a disc with a 500 V rating. As shown at point 922, before the surge test, the return loss is −13.4 when the effective capacitance is 0.08 pF. At point 924, after the surge test, the return loss is −13.3 when the effective capacitance is 0.09 pF. The top line 930 represents results when the capacitor 160 is a multilayer ceramic capacitor (MLCC) with a 2 kV rating. As shown at point 932, before the surge test, the return loss is −14.5 when the effective capacitance is 0.13 pF. At point 934, after the surge test, the return loss is −14.2 when the effective capacitance is 0.18 pF.

The return loss measurements are taken with a shunt capacitance of an 89 μm (i.e., ~3.5 mil) introduced by a bridged spark gap (e.g., spark gap 330, 430, or 530), a high voltage blocking capacitor 160 (e.g., with a voltage rating of 500 V, 1 kV, or 2 kV), and a 75-ohm termination resistor. The surge measurements were taken with a shunt capacitance of an 89 μm (i.e., ~3.5 mil) introduced by a bridged spark gap (e.g., spark gap 330, 430, or 530), a high voltage blocking capacitor 160 (e.g., with a voltage rating of 500 V, 1 kV, or 2 kV), and a short to ground.

Table 1 below includes the spark gap performance characteristics and the performance target(s) for the circuit 800, according to an embodiment.

TABLE 1

| Spark Gap Performance Characteristics | | Performance Target |
|---|---|---|
| Effective Shunt Capacitance | About 0.1 pF | <0.2 pF |
| Post Surge Capacitance Change | ±0.05 pF | <±0.1 pF |
| Initial Arc Voltage | 1250 V ± 250 V | <2 KV |
| Surge Withstand Event Count | ½ samples > 50 (test halted) ½ samples > 96 (test halted) | >96 (3× the SCTE 32 Step Standard) |
| Surge Withstand Power Dissipation | >915 Mega Watts (Instantaneous sum not actual total which is greater) | >=915 MW (3× the SCTE 32 Step Standard) |
| Blocking Capacitors Acceptable Type & Ratings | 2 KV 1206 MLCC 500 V & 1 KV Ceramic Disc | |

In this test, the surge events were halted without circuit damage after 50 events in most cases when the instantaneous sum power dissipation met or exceeded three times that of the surge test standard: IEEE C 62.41 Category B3 Combination Waveform as specified by SCTE 81. Exposing various test samples to only 50 surge events implemented at a set higher 6 KV 3 KA level met or exceeded the 96 stepped events defined in the standard because the power dissipation was met or exceeded and confirmed by splitting the samples tested with stepped or set event levels.

As may be seen, the spark gaps 130, 230, 330, 430, 530 have a relatively low capacitance, have a low impact on circuit return loss, and are robust or they have a high surge withstand and life. The MLCC capacitor 160 adds more inherent capacitance to the circuit 800. The 1 kV disc capacitor 160 adds less inherent capacitance to the circuit 800. The disc capacitors perform greater than 2× their voltage rating. The tinned copper wires (e.g., pins or staples 332, 340, 440, 540) erode as a result of the testing, which increases the gap size therebetween. The tinned copper wires have a cross-sectional width (e.g., diameter) from about 381 µm (i.e., ~15 mil) to about 1016 µm (i.e., ~40 mil). This may lower the capacitance, but the capacitance of the circuit 800 may increase due to conductive carbon residue from the testing. The testing resulted in a low initial arc voltage and range from about 1250 V+/−250 V. The circuit 800 is robust and can withstand greater than 3× the SCTE standard. The dielectric material 150 may be paper, which provides a low and consistent arc voltage due to more consistent gapping during assembly.

In one embodiment, a lightning protection spark gap circuit for a CATV line and/or a drop device is disclosed. The spark gap circuit may include low initial arc voltage, low parasitic capacitance or intrinsic reactance, low cost, ease of manufacture, robust life, and consistent performance. The spark gap circuit may be validated by the Institute of Electrical and Electronics Engineers (IEEE) C 62.41 Category B3 combination waveform as specified by the Society of Cable Telecommunications Engineers (SCTE) 81 2012. The spark gap circuit may be configured to operate through a 6 kV, 3 kA, 2 ohm standard 1.2/50 µS-8/20 µS combo wave surge. The spark gap circuit may also operate at this level through at least 32 incremental events.

In another embodiment, the spark gap circuit may be validated by the IEEE C 62.41 Category B3 ring waveform as specified by the SCTE 81 2012. The spark gap circuit may be configured to operate through a 6 kV, 500 A, 12 ohm standard 0.5 µS ring wave surge. The spark gap circuit may be configured to operate at this level through at least 32 incremental events.

In another embodiment, the spark gap circuit may be validated by the IEEE C 62.41 Category A3 ring waveform as specified by the SCTE 81 2012. The spark gap circuit may be configured to operate through a 6 kV, 200 A, 30 ohm standard 0.5 µS ring wave surge. The spark gap circuit may be configured to operate at this level through at least 32 incremental events.

The spark gap circuits on a printed circuit board (PCB) may be followed by series blocking capacitance characterized by surface mount technology (SMT) 1206 2 kV followed by 0805 100 V or greater; TH 1 kV or greater, SMT 1206 1 kV or greater (e.g., for A3 ring only), TH 200 V or greater (e.g., for A3 ring only), or a combination thereof.

In one embodiment, the spark gap circuit may be or include a planer spark gap circuit on a PCB that includes a base conductor material (e.g., 1 ounce of copper). The planer spark gap circuit may also include a hot air solder leveling (HASL) plating to increase mass in the Z axis. The planer spark gap circuit may also include a gap between two or more electrodes that is from about 3.5 mil to about 6.5 mil. The planer spark gap circuit may also include an electrode separation from about 10 mil to about 20 mil. The planer spark gap circuit may also include an electrode geometry that is, for example, blunt to blunt. This may include a tip that is from about 5 mil to about 10 mil, and a length from the conductor or ground that is from about 5 mil to about 10 mil. The planer spark gap circuit may also include a conductor and ground mass that is greater than about 50×20 mil for a ring wave and/or greater than about 150×50 mil for a combo wave. The planer spark gap circuit may also include plated through holes that may be configured to increase mass either unfilled or solder filled (e.g., for a combo wave).

In another embodiment, the spark gap circuit may be or include a bridge spark gap circuit on a PCB that includes an electrode cross-section that is from about 10 mil to about 40 mil in diameter (or equivalent cross sectional area in other geometries). The bridge spark gap circuit may also include an electrode length that is greater than about 30 mil. The bridge spark gap circuit may also include an electrode orientation that is about 90 degrees (e.g., perpendicular) from the conductor to ground. The bridge spark gap circuit may also include a single electrode or multiple electrodes for ground. The bridge spark gap circuit may also include multiple electrodes that may be separated by air or another dielectric material (e.g., gas) that is from about 3 mil to about 5 mil thick. The bridge spark gap circuit may also include a gap dielectric constant that is less than about 3.5 (e.g., paper at 2.3).

In another embodiment, the spark gap circuit may be or include a staple or pin spark gap circuit on a PCB that includes an electrode diameter from about 10 mil to about 40 mil (or equivalent cross sectional area in other geometries). The staple or pin spark gap circuit may also include an electrode length that is greater than about 30 mil. The staple or pin spark gap circuit may also include an electrode orientation that is about 90 degrees (e.g., perpendicular) from the conductor to ground. The staple or pin spark gap circuit may also include multiple electrodes in line with the conductor. The staple or pin spark gap circuit may also include one or more electrodes that is/are perpendicular to ground. The staple or pin spark gap circuit may also include one or more electrodes that are separated from ground by air or another dielectric material (e.g., gas) that is from about 3 mil to about 5 mil thick. The bridge spark gap circuit may also include a gap dielectric constant that is less than about 3.5 (e.g., paper).

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims. The present disclosure is not to be limited in terms of the particular embodiments described in this application, which are intended as illustrations of various aspects. Many modifications and variations can be made without departing from its spirit and scope, as will be apparent to those skilled in the art. Functionally equivalent apparatuses within the scope of the disclosure, in addition to those enumerated herein will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." In addition, where features or aspects of the disclosure are described in terms of Markush groups, those skilled in the art will recognize that the disclosure is also thereby described in terms of any individual member or subgroup of members of the Markush group.

What is claimed is:

1. A spark gap circuit, comprising:
a circuit board;
an input configured to connect to the circuit board and to receive signals;
a spark gap configured to connect to the circuit board and the input, the spark gap comprising:
a first conducting electrode;
a second conducting electrode that is grounded; and
a dielectric material configured to be positioned within a gap between the first and second conducting electrodes;
a first capacitor configured to connect to the circuit board and the spark gap;
a second capacitor configured to connect to the circuit board and the first capacitor;
an output configured to connect to the circuit board and the second capacitor;

wherein the spark gap is configured to cause a return loss between the input and the output to be within a first predetermined range;
wherein the spark gap is configured to cause a parasitic capacitance between the input and the output to be within a second predetermined range;
wherein the first conducting electrode has a length from about 750 μm to about 2000 μm;
wherein the first conducting electrode has a diameter from about 500 μm to about 1 mm;
wherein the first conducting electrode has a mass from about 1 gram to about 100 grams;
wherein a signal trace extends from the input to the first capacitor;
wherein the first conducting electrode is substantially parallel with the signal trace;
wherein the second conducting electrode comprises a staple with two leads and a cross bar positioned therebetween;
wherein the two leads are substantially perpendicular to the circuit board;
wherein the cross bar is substantially perpendicular to the first conducting electrode and the signal trace;
wherein the cross bar is positioned farther away from the circuit board than the first conducting electrode such that the gap exists therebetween;
wherein a thickness of the gap is from about 150 μm to about 250 μm;
wherein a thickness of the dielectric material is from about 75 μm to about 125 μm;
wherein the dielectric material comprises air, paper, or a combination thereof;
wherein the dielectric material has a relative permittivity from about 1 to about 3;
wherein the first and second capacitors are configured to block direct current (DC) flow therethrough and to provide surge protection;
wherein a voltage rating of the first capacitor is greater than a voltage rating of the second capacitor; and
wherein the output is configured to connect to a cable or a device.

2. The spark gap circuit of claim 1, wherein the first predetermined range is from about 15 dB to about 40 dB within a cable television (CATV) bandwidth.

3. The spark gap circuit of claim 1, wherein the second predetermined range is from about 0.01 pF to about 0.05 pF.

4. The spark gap circuit of claim 1, wherein the first conducting electrode is configured to increase an impedance of the signal trace, as measured by return loss, from about 0.01 dB to about 1 dB.

5. A spark gap circuit, comprising:
a circuit board;
an input configured to connect to the circuit board and to receive signals;
a spark gap configured to connect to the circuit board and the input, the spark gap comprising:
a first conducting electrode;
a second conducting electrode that is grounded; and
a dielectric material positioned within a gap between the first and second conducting electrodes;
a first capacitor configured to connect to the circuit board and the spark gap;
an output configured to connect to the circuit board and the first capacitor;
wherein a signal trace extends from the input to the first capacitor;

wherein the first conducting electrode is substantially parallel with the signal trace;
wherein the second conducting electrode comprises a staple with two leads and a cross bar positioned therebetween;
wherein the two leads are substantially perpendicular to the circuit board;
wherein the cross bar is substantially perpendicular to the first conducting electrode and the signal trace;
wherein the cross bar is positioned farther away from the circuit board than the first conducting electrode such that the gap exists therebetween;
wherein the spark gap is configured to cause a return loss between the input and the output to be within a first predetermined range;
wherein the spark gap is configured to cause a parasitic capacitance between the input and the output to be within a second predetermined range; and
wherein the output is configured to connect to a cable or a device.

6. The spark gap circuit of claim 5, wherein the first predetermined range is from about 20 dB to about 50 dB within a cable television (CATV) bandwidth.

7. The spark gap circuit of claim 5, wherein the second predetermined range is from about 0.01 pF to about 0.1 pF.

8. The spark gap circuit of claim 5, wherein the first conducting electrode is configured to increase an impedance of the signal trace, as measured by return loss, from about 0.01 dB to about 1 dB.

9. The spark gap circuit of claim 5, wherein the first conducting electrode has a length from about 750 μm to about 2000 μm, wherein the first conducting electrode has a diameter from about 500 μm to about 1 mm, and wherein the first conducting electrode has a mass from about 1 gram to about 100 grams.

10. The spark gap circuit of claim 5, wherein a thickness of the gap is from about 150 μm to about 250 μm.

11. The spark gap circuit of claim 5, wherein a thickness of the dielectric material is from about 75 μm to about 125 μm, wherein the dielectric material comprises air, paper, or a combination thereof, and wherein the dielectric material has a relative permittivity from about 1 to about 3.

12. The spark gap circuit of claim 5, further comprising a second capacitor configured to be connected to the circuit board and the first capacitor.

13. The spark gap circuit of claim 12, wherein the first and second capacitors are configured to block direct current (DC) flow therethrough and to provide surge protection, and wherein a voltage rating of the first capacitor is greater than a voltage rating of the second capacitor.

14. A spark gap circuit, comprising:
a circuit board;
an input configured to connect to the circuit board and to receive signals;
a spark gap configured to connect to the circuit board and the input;
an output configured to connect to the spark gap;
a first capacitor configured to connect to the circuit board and the spark gap;
a second capacitor configured to connect to the circuit board, the first capacitor, and the output;
wherein the spark gap is configured to cause a return loss between the input and the output to be within a first predetermined range; and
wherein the spark gap is configured to cause a parasitic capacitance between the input and the output to be within a second predetermined range.

15. The spark gap circuit of claim 14, wherein the first predetermined range is from about 25 dB to about 60 dB within a cable television (CATV) bandwidth.

16. The spark gap circuit of claim 14, wherein the second predetermined range is from about 0.01 pF to about 0.2 pF.

17. The spark gap circuit of claim 14, wherein the spark gap comprises:
a first conducting electrode;
a second conducting electrode that is grounded; and
a dielectric material positioned between the first and second conducting electrodes.

18. The spark gap circuit of claim 17, wherein the first conducting electrode is configured to increase an impedance of a signal trace between the input and the output, as measured by return loss, from about 0.01 dB to about 1 dB.

19. The spark gap circuit of claim 17, wherein the first conducting electrode has a length from about 750 μm to about 2000 μm, wherein the first conducting electrode has a diameter from about 500 μm to about 1 mm, and wherein the first conducting electrode has a mass from about 1 gram to about 100 grams.

20. The spark gap circuit of claim 17, wherein a thickness of a gap between the first and second conducting electrodes is from about 150 μm to about 250 μm.

21. The spark gap circuit of claim 17, wherein a thickness of the dielectric material is from about 75 μm to about 125 μm, wherein the dielectric material comprises air, paper, or a combination thereof, and wherein the dielectric material has a relative permittivity from about 1 to about 3.

22. The spark gap circuit of claim 17, wherein the second conducting electrode is not connected to the circuit board.

23. The spark gap circuit of claim 17, wherein the second conducting electrode comprises a plate that is substantially parallel with the circuit board, and wherein the first conducting electrode is substantially perpendicular with the plate.

24. The spark gap circuit of claim 17, wherein the first conducting electrode is substantially perpendicular to the circuit board and extends through the circuit board.

25. The spark gap circuit of claim 17, wherein the first conducting electrode comprises a first staple with two leads and a cross bar positioned therebetween, wherein the cross bar of the first staple is substantially parallel with a signal trace, and wherein the signal trace extends from the input to the output.

26. The spark gap circuit of claim 25, wherein the cross bar of the first staple is positioned on a first side of the circuit board.

27. The spark gap circuit of claim 26, wherein the second conducting electrode is positioned on a second side of the circuit board.

28. The spark gap circuit of claim 26, wherein the second conducting electrode is positioned on the first side of the circuit board.

29. The spark gap circuit of claim 28, wherein the second conducting electrode comprises a second staple with two leads and a cross bar positioned therebetween, wherein the cross bars of the first and second staples are substantially perpendicular to one another, and wherein a gap is defined between the cross bars of the first and second staples.

30. A spark gap circuit, comprising:
a circuit board;
an input configured to connect to the circuit board and to receive signals;
a spark gap configured to connect to the circuit board and the input;

an output configured to connect to the spark gap;
a first conducting electrode;
a second conducting electrode that is grounded;
a dielectric material positioned between the first and second conducting electrodes;
a first capacitor configured to connect to the circuit board and the spark gap;
a second capacitor configured to connect to the circuit board, the first capacitor, and the output;
wherein the spark gap is configured to cause a return loss between the input and the output to be within a first predetermined range; and
wherein the spark gap is configured to cause a parasitic capacitance between the input and the output to be within a second predetermined range.

31. The spark gap circuit of claim 30, wherein the first and second capacitors are configured to block direct current (DC) flow therethrough and to provide surge protection, and wherein a voltage rating of the first capacitor is greater than a voltage rating of the second capacitor.

32. The spark gap circuit of claim 30, wherein the first conducting electrode is substantially parallel with a signal trace, and wherein the signal trace extends from the input to the first capacitor.

33. The spark gap circuit of claim 30, wherein the first conducting electrode is substantially perpendicular with a signal trace, and wherein the signal trace extends from the input to the first capacitor.

34. The spark gap circuit of claim 33,
wherein the second conducting electrode comprises a staple with two leads and a cross bar positioned therebetween,
the two leads are substantially perpendicular to the circuit board,
the cross bar is substantially perpendicular to the first conducting electrode and the signal trace, and
the cross bar is configured to be located farther away from the circuit board than the first conducting electrode such that a gap exists between the first conducting electrode and the cross bar.

35. A spark gap circuit configured to provide an enhanced return loss comprising:
a spark gap structure configured to be connected to a circuit board and an input;
a capacitor-in-series structure configured to be connected to the spark gap structure and an output so as to store an electrical charge;
wherein the spark gap structure is configured to cooperate with the electrical charge stored by the capacitor-in-series structure so as to generate an enhanced return loss between the input and the output of the spark gap circuit;
wherein the enhanced return loss is within a predetermined return loss threshold; and
wherein the predetermined return loss threshold is between about 15 dB to about 40 dB.

36. The spark gap circuit of claim 35, wherein the input is configured to receive signals.

37. The spark gap circuit of claim 35, wherein the capacitor-in-series structure is configured to block direct current (DC) flow therethrough and to provide surge protection.

38. The spark gap circuit of claim 35, wherein the capacitor-in-series structure comprises a first capacitor and a second capacitor.

39. The spark gap circuit of claim 38, wherein the first capacitor and the second capacitor are only connected in series.

40. The spark gap circuit of claim 38, wherein the first capacitor is configured to be connected to the circuit board and the spark gap structure.

41. The spark gap circuit of claim 38, wherein the second capacitor is configured to be connected to the circuit board, the first capacitor, and the output.

42. A spark gap circuit configured to provide an enhanced parasitic capacitance comprising:
a spark gap structure configured to be connected to a circuit board and an input;
a capacitor-in-series structure configured to be connected to the spark gap structure and an output so as to store an electrical charge;
wherein the spark gap structure is configured to cooperate with the electrical charge stored by the capacitor-in-series structure so as to generate an enhanced parasitic capacitance between the input and the output of the spark gap circuit;
wherein the enhanced parasitic capacitance comprises a predetermined parasitic capacitance threshold; and
wherein the predetermined parasitic capacitance threshold is from about 0.01 pF to about 0.1 pF.

43. The spark gap circuit of claim 42, wherein the input is configured to receive signals.

44. The spark gap circuit of claim 42, wherein the capacitor-in-series structure is configured to block direct current (DC) flow therethrough and to provide surge protection.

45. The spark gap circuit of claim 42, wherein the capacitor-in-series structure comprises a first capacitor and a second capacitor.

46. The spark gap circuit of claim 45, wherein the first capacitor and the second capacitor are only connected in series.

47. The spark gap circuit of claim 45, wherein the first capacitor is configured to be connected to the circuit board and the spark gap structure.

48. The spark gap circuit of claim 45, wherein the second capacitor is configured to be connected to the circuit board, the first capacitor, and the output.

49. A spark gap circuit configured to achieve an enhanced return loss or enhanced parasitic capacitance comprising:
a spark gap structure configured to be connected to a circuit board;
a capacitor structure configured to store an electrical charge;
wherein the spark gap structure is configured to generate an enhanced return loss or an enhanced parasitic capacitance of the spark gap circuit;
wherein the enhanced return loss comprises a predetermined return loss level;
wherein the predetermined return loss level is between about 15 dB to about 40 dB;
wherein the enhanced parasitic capacitance comprises a predetermined parasitic capacitance level; and
wherein the predetermined parasitic capacitance level is from about 0.01 pF to about 0.1 pF.

50. The spark gap circuit of claim 49, wherein the spark gap structure is configured to be connected to an input that is configured to receive signals.

51. The spark gap circuit of claim 50, wherein the capacitor structure is configured to be connected to the spark gap structure and an output so as to store the electrical charge.

52. The spark gap circuit of claim 51, wherein the spark gap structure is configured to cooperate with the electrical charge stored by the capacitor structure so as to generate the enhanced return loss or the enhanced parasitic capacitance between the input and the output of the spark gap circuit.

53. The spark gap circuit of claim 49, wherein the spark gap structure is configured to cooperate with the electrical charge so as to generate the enhanced return loss or the enhanced parasitic capacitance between an input and an output of the spark gap circuit.

54. The spark gap circuit of claim 49, wherein the capacitor structure is configured to block direct current (DC) flow therethrough so as to provide surge protection.

55. The spark gap circuit of claim 49, wherein the capacitor structure comprises a first capacitor and a second capacitor.

56. The spark gap circuit of claim 55, wherein the first capacitor and the second capacitor are connected in series.

57. The spark gap circuit of claim 55, wherein the first capacitor is configured to be connected to the circuit board and the spark gap structure.

58. The spark gap circuit of claim 49, wherein the capacitor structure comprises a capacitor-in-series structure.

59. The spark gap circuit of claim 58, wherein the capacitor-in-series structure comprises a first capacitor and a second capacitor thar are only connected in series.

\* \* \* \* \*